(12) United States Patent
Lin

(10) Patent No.: US 7,330,058 B2
(45) Date of Patent: Feb. 12, 2008

(54) CLOCK AND DATA RECOVERY CIRCUIT AND METHOD THEREOF

(75) Inventor: Joanna Lin, Taipei (TW)

(73) Assignee: Via Technologies, Inc., Taipei (TW)

( * ) Notice: Subject to any disclaimer, the term of this patent is extended or adjusted under 35 U.S.C. 154(b) by 35 days.

(21) Appl. No.: 11/477,951

(22) Filed: Jun. 30, 2006

(65) Prior Publication Data

US 2007/0001723 A1 Jan. 4, 2007

Related U.S. Application Data

(60) Provisional application No. 60/695,431, filed on Jul. 1, 2005.

(51) Int. Cl.
*H03L 7/06* (2006.01)

(52) U.S. Cl. .................. 327/157; 327/148

(58) Field of Classification Search .................. None
See application file for complete search history.

(56) References Cited

U.S. PATENT DOCUMENTS

| | | | | |
|---|---|---|---|---|
| 5,180,993 A | * | 1/1993 | Dent ........................... | 331/16 |
| 5,610,954 A | * | 3/1997 | Miyashita et al. ........... | 375/375 |
| 6,011,822 A | * | 1/2000 | Dreyer ........................ | 375/376 |
| 6,614,316 B2 | * | 9/2003 | Masenas et al. ............. | 331/17 |
| 6,690,240 B2 | * | 2/2004 | Maxim et al. ............... | 331/17 |
| 6,909,329 B2 | * | 6/2005 | Jasa et al. .................... | 331/1 A |
| 6,998,923 B2 | * | 2/2006 | Melanson .................... | 331/17 |
| 7,019,571 B2 | * | 3/2006 | Lim ............................. | 327/157 |
| 7,095,287 B2 | * | 8/2006 | Maxim et al. ............... | 331/44 |
| 7,212,051 B1 | * | 5/2007 | Zhu et al. .................... | 327/156 |
| 2005/0111605 A1 | * | 5/2005 | Loke et al. .................. | 375/375 |

* cited by examiner

*Primary Examiner*—N. Drew Richards
*Assistant Examiner*—Cassandra Cox
(74) *Attorney, Agent, or Firm*—Birch, Stewart, Kolasch & Birch, LLP

(57) ABSTRACT

A clock and data recovery circuit having parallel dual path is disclosed, which includes a phase detecting circuit, a first charge pump, a proportional load circuit, a second charge pump, an integration load circuit, and a voltage control oscillating circuit. The phase detecting circuit respectively compares a phase difference between a data signal and a plurality of clock signals to generate two proportional control signal and two integration control signal for respectively controlling the first charge pump and the second charge pump to generate a first current and a second current. The proportional load circuit and the integration load circuit respectively receive the first current and the second current to output a proportional voltage and an integration voltage. The voltage control oscillating circuit adjusts the phase and frequency of the plurality of clock signals in response to the proportional voltage and the integration voltage.

13 Claims, 8 Drawing Sheets

US 7,330,058 B2

CLOCK AND DATA RECOVERY CIRCUIT AND METHOD THEREOF

This application claims the benefit of U.S. Provisional Application Ser. No. 60/695,431, entitled "CLOCK DATA RECOVERY HAVING MULTI-CONTROL PATH", filed Jul. 1, 2005.

BACKGROUND OF THE INVENTION

1. Field of Invention

The invention relates to a clock and data recovery circuit and a method thereof, and, in particular, to a clock and data recovery circuit including parallel control paths separated from each other and a method thereof.

2. Related Art

In the modern communication system, high-speed serial signal transmission gradually replaces the conventional parallel signal transmission. During the high-speed sequential signal transmission, the original low-speed parallel signal is converted into a high-speed serial signal to facilitate the transmission. Thus, a clock generating circuit is provided to generating a high-speed clock signal for sampling the high-speed sequential signal. And a clock and data recovery circuit is provided to recover the sampled high-speed serial signal at the receiving terminal. The clock and data recovery circuit is typically implemented with a phase-locked loop circuit, and compares the phase difference between a clock signal and the sampled high-speed serial signal, which is hereinafter referred to as the data signal. Thus, the self-calibrations of the clock signal and the data signal can be achieved, and the error rate of recovering the data signal may be reduced.

FIG. 1 is a block diagram showing a conventional clock and data recovery circuit 1. Referring to FIG. 1, the clock and data recovery circuit 1 includes a phase detecting circuit 11, a charge pump 12, a filter 13 and a voltage control oscillator 14. The phase detecting circuit 11 receives a data signal DATA and a local clock CLK, it compares a phase difference between the data signal DATA and the local clock CLK to generate two control signals UP, DN. The phase detecting circuit 11 is a bang-bang phase detector or a binary phase detector. The control signals UP, DN control one set of switches 121 in the charge pump 12 to turn on one set of current sources 122 such that the current I inputted to or outputted from the set of current sources 122 charges/discharges the filter 13 to generate an output voltage V. The output voltage V controls the voltage control oscillator 14 to adjust the phase of the local clock CLK such that the phase difference between the local clock CLK and the data signal DATA are held constantly. The filter 13 including a resistor 131 and a capacitor 132 filter the current I generated from the charge pump 12. The resistor 131 and the capacitor 132 are connected in series, and the other terminal of the capacitor 132 is grounded. In addition, the filter 13 further includes a capacitor 133 for suppressing the high frequency jitter. The other terminal of the capacitor 133 is also grounded. Usually, the capacitance of the capacitor 133 is much smaller than that of the capacitor 132, so the capacitor 133 is thus neglected in this case.

In the above-mentioned architecture, the voltage control oscillator 14 is mainly controlled by a single control path, which includes a proportional path and an integration path. The proportional path is the path of the current I flowing through the resistor 131. The integration path is the path of the current I flowing through the capacitor 132. In the proportional path, the current I provides a proportional gain directly proportional to the product of the current I and the resistance R related to the resistor 131. In the integration path, the current I provides an integration gain directly proportional to the ratio of the current I to the capacitance C related to the capacitor 132. A stability factor is defined as the ratio of the proportional gain to the integration gain. If the stability factor is higher, the system is more stable. In this case, the stability factor is equal to R×C. In order to obtain a better stability factor, the prior art usually increases the resistance R or/and capacitance C. If the resistance R is increased, the proportional gain and the voltage V are increased such that the voltage control oscillator 14 adjusts the local clock CLK more quickly. Therefore the phase of local clock CLK responses to the phase of the data signal DATA immediately. If the capacitance C is increased, the integration gain and the voltage V are decreased. It is therefore to prevent the voltage control oscillator 14 from adjusting the frequency of the local clock CLK too sensitively.

In summary of the proportional path and the integration path, the increased current I causes the proportional gain and the integration gain raise. Therefore the capacitance C is designed as larger for reducing the integration gain. On the contrary, the decreased current I causes the proportional gain and the integration gain reduce. Therefore the resistance R is designed as larger for raising the proportional gain. However, neither the larger resistance R nor the larger capacitance C is provided, it is costly for the clock and data recovery circuit 1.

In addition, the current I flowing through the single control path in the above-mentioned architecture simultaneously influences the proportional gain and the integration gain. Thus, the current I, the resistance R related to the resistor 131 and the capacitance C related to the capacitor 132 are not easy to adjust and design. The clock and data recovery circuit 1 is not easy to regulate and optimize, and its efficiency is hard to raise. Consequently, it is an important subject of the invention to provide a clock and data recovery circuit to solve the above-mentioned problems.

SUMMARY OF THE INVENTION

The invention provides a clock and data recovery circuit including parallel control paths separated from each other and a method thereof.

The invention discloses a clock and data recovery circuit having parallel dual path. The clock and data recovery circuit includes a phase detecting circuit, a first charge pump, a proportional load circuit, a second charge pump, an integration load circuit, and a voltage control oscillating circuit. The phase detecting circuit respectively compares a phase difference between a data signal and a plurality of clock signals to generate two proportional control signals and two integration control signals for respectively controlling the first charge pump and the second charge pump to generate a first current and a second current. The proportional load circuit and the integration load circuit respectively receive the first current and the second current to output a proportional voltage and an integration voltage. The voltage control oscillating circuit adjusts the phase and frequency of the plurality of clock signals in response to the proportional voltage and the integration voltage. In addition, the clock signals have the same frequency but different phases, and the frequency of the data signal is a multiple of the frequency of the clock signals.

The invention also discloses a clock and data recovery method. The method includes the following steps of: comparing a phase difference between a data signal and a plurality of clock signals to generate two proportional control signals and two integration control signals; controlling a first charge pump to generate a first current in response to the two proportional control signals, wherein the first current is injected into a proportional load circuit to output a proportional voltage proportionally; controlling a second charge pump to generate a second current in response to the two integration control signals, wherein the second current is injected into an integration load circuit to output an integration voltage; and adjusting phases and frequency of the clock signals in response to the proportional voltage and the integration voltage, wherein the clock signals have the same frequency but different phases, and the frequency of the data signal is a multiple of the frequency of the clock signals.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The clock and data recovery circuit and the method according to the embodiment of the invention will be described with reference to the accompanying drawings.

Figure 1:
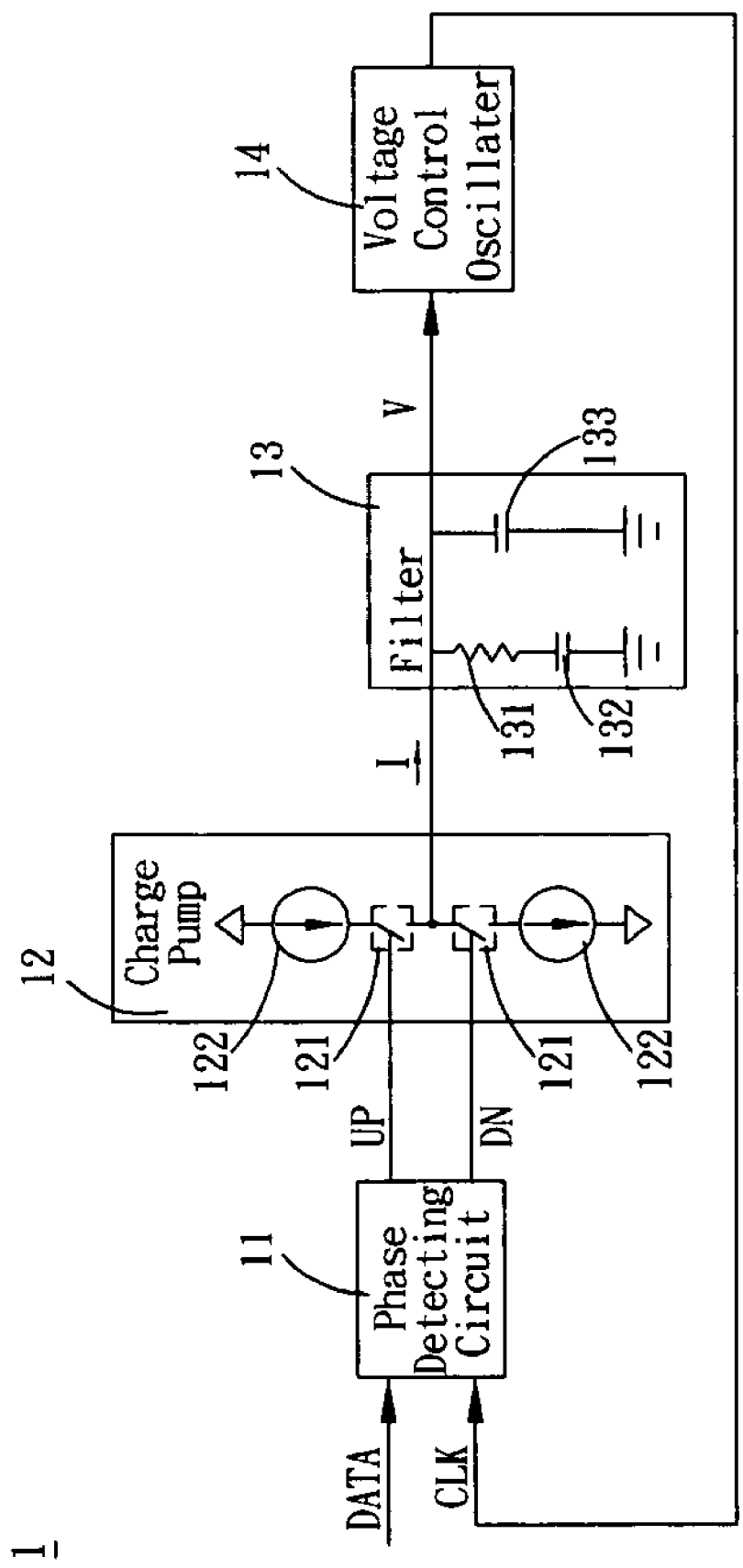
FIG. 1 is a block diagram showing a conventional clock and data recovery circuit.
Figure 2:
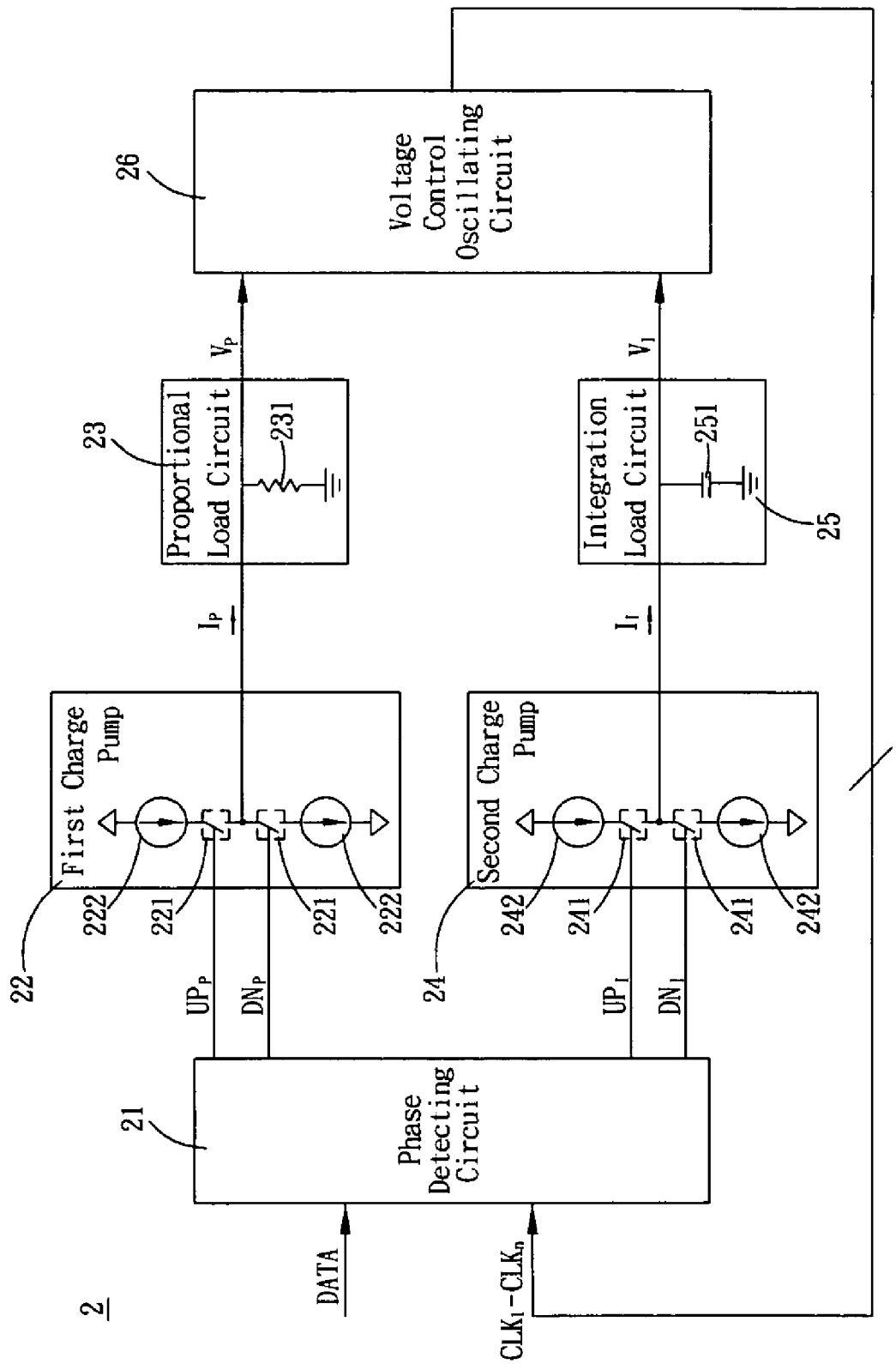
FIG. 2 is a block diagram showing a clock and data recovery circuit according to an embodiment of the invention.

FIG. 2 is a block diagram showing a clock and data recovery circuit according to an embodiment of the invention. Referring to FIG. 2, the clock and data recovery circuit 2 includes a phase detecting circuit 21, a first charge pump 22, a proportional load circuit 23, a second charge pump 24, an integration load circuit 25 and a voltage control oscillating circuit 26. The phase detecting circuit 21 compares a phase difference between a data signal DATA and a plurality of clock signals $CLK_1$-$CLK_n$ to generate two proportional control signals $UP_P$, $DN_P$ and two integration control signals $UP_I$, $DN_I$. The clock signals $CLK_1$-$CLK_n$ have the same frequency but different phases, and the frequency of the data signal DATA is a multiple of the frequency of the clock signals $CLK_1$-$CLK_n$.

The two proportional control signals $UP_P$, $DN_P$ control one set of switches 221 in the first charge pump 22 to turn on one set of current sources 222 for generating a first current $I_P$. The proportional load circuit 23 receives the first current $I_P$ and outputs a proportional voltage $V_P$ in proportion to the first current $I_P$. The two integration control signals $UP_I$, $DN_I$ control one set of switches 241 in the second charge pump 24 to turn on one set of current sources 242 for generating a second current $I_I$. The integration load circuit 25 receives the second current $I_I$ to output an integration voltage $V_I$. The voltage control oscillating circuit 26 receives the proportional voltage $V_P$ and the integration voltage $V_I$, and it adjusts the phase and frequency of the clock signals $CLK_1$-$CLK_n$ in response to the proportional voltage $V_P$ and the integration voltage $V_I$.

In this embodiment, the proportional load circuit 23 includes a resistor 231. The first current $I_P$ is injected into one terminal of the resistor 231 to output the proportional voltage $V_P$ at this terminal. The integration load circuit 25 includes a capacitor 251. The second current $I_I$ charges/discharges one terminal of the capacitor 251 to output the integration voltage $V_I$ at this terminal. The other terminals of the resistor 231 and the capacitor 251 are respectively grounded or connected to a bias voltage. In the above-mentioned architecture, the proportional control signals $UP_P$, $DN_P$, the first charge pump 22, the proportional load circuit 23 and the proportional voltage $V_P$ form a proportional control path. The integration control signals $UP_I$, $DN_I$, the second charge pump 24, the integration load circuit 25 and the integration voltage $V_I$ form an integration control path. Thus, the proportional control path and the integration control path are parallel to and separated from each other, and each stage circuit and gain in the proportional control path or in the integration control path are adjustable individually.

Because the capacitor 251 can hold the voltage potential, the proportional voltage $V_P$ is more sensitive to the first current $I_P$, and the integration voltage $V_I$ is less sensitive to the second current $I_I$. When the clock signals $CLK_1$-$CLK_n$ are not locked with the data signal DATA, the proportional voltage $V_P$ responses quickly and drives the voltage control oscillating circuit 26 to adjust the phase of the clock signals $CLK_1$-$CLK_n$. Therefore, the clock and data recovery circuit 2 generates less signal jitters. In addition, when the clock signals $CLK_1$-$CLK_n$ are locked with the data signal DATA, the integration voltage $V_I$ holds the voltage control oscillating circuit 26 to output the clock signals $CLK_1$-$CLK_n$ so as to improve the jitter tolerance in the clock and data recovery circuit 2.

Figure 3A:
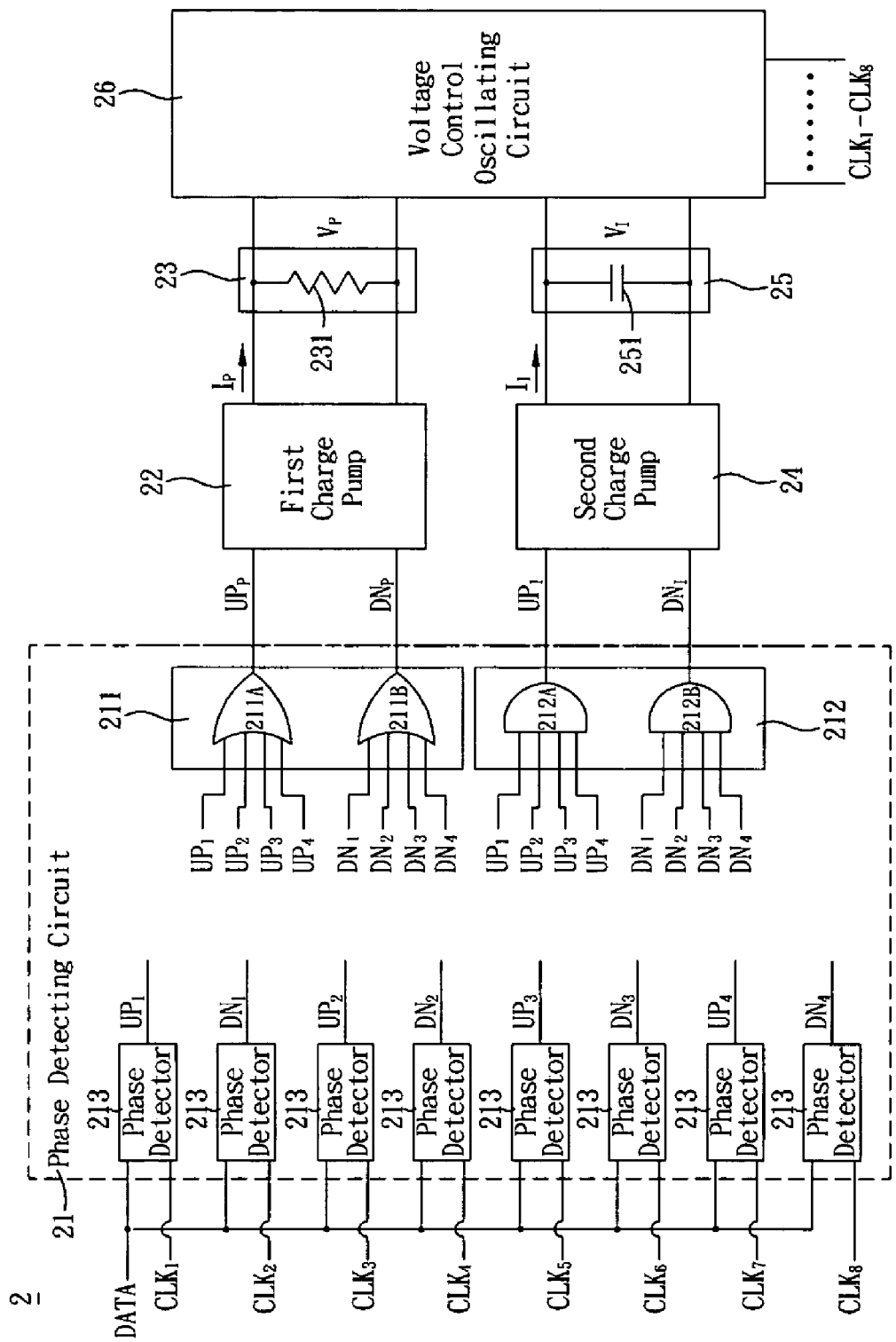
FIG. 3A is another block diagram showing the clock and data recovery circuit according to the embodiment of the invention.
Figure 6:
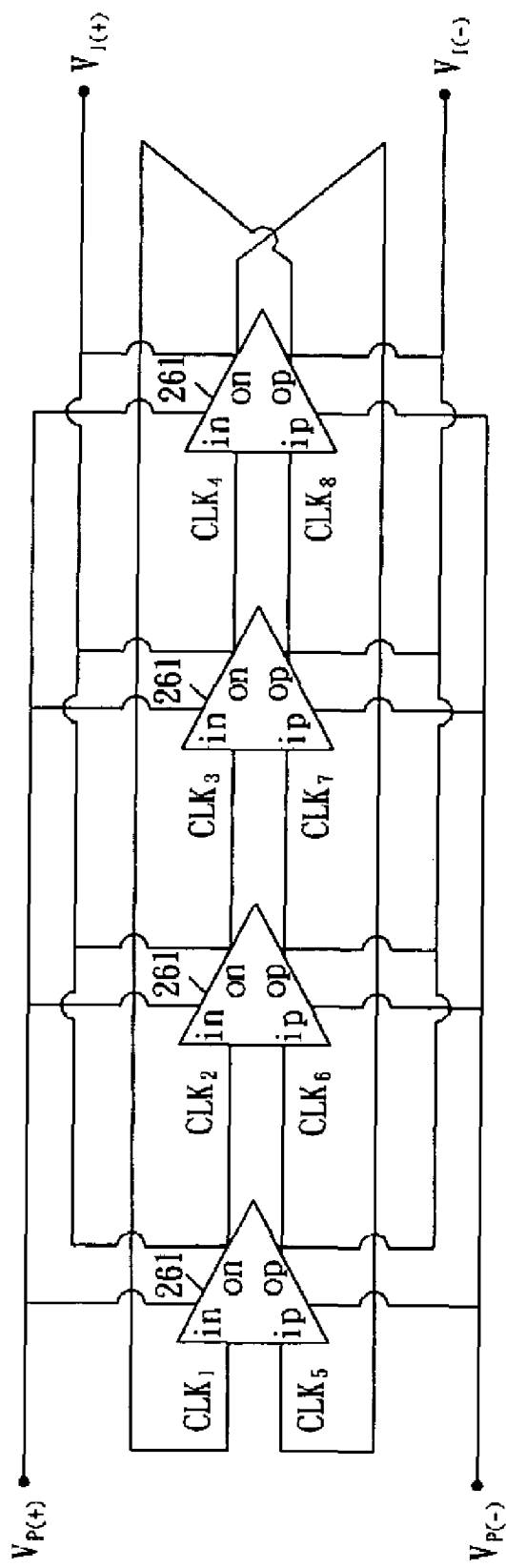
FIG. 6 is a circuit diagram showing the voltage control oscillating circuit of the clock and data recovery circuit according to the embodiment of the invention.

The operation of the clock and data recovery circuit 2 will be illustrated with reference to an example. As shown in FIGS. 3A and 6, the voltage control oscillating circuit 26 in this example includes four stages of oscillating units 261 for generating eight clock signals $CLK_1$-$CLK_8$ with eight different phases. The clock signals $CLK_1$-$CLK_8$ have the same frequency, which is one fourth that of the data signal DATA. In FIG. 6, the voltage control oscillating circuit 26 is a differential voltage control oscillator operating in a differential mode. Each stage of oscillating unit 261 receives two clock signals with 180 degree phase difference from the previous stage of oscillating unit 261. And it has two differential input terminals for respectively receiving the proportional voltage $V_P$ and the integration voltage $V_I$. Thus, the phases and frequency of the clock signals outputted from each stage of oscillating unit 261 are adjustable.

Figure 3B:
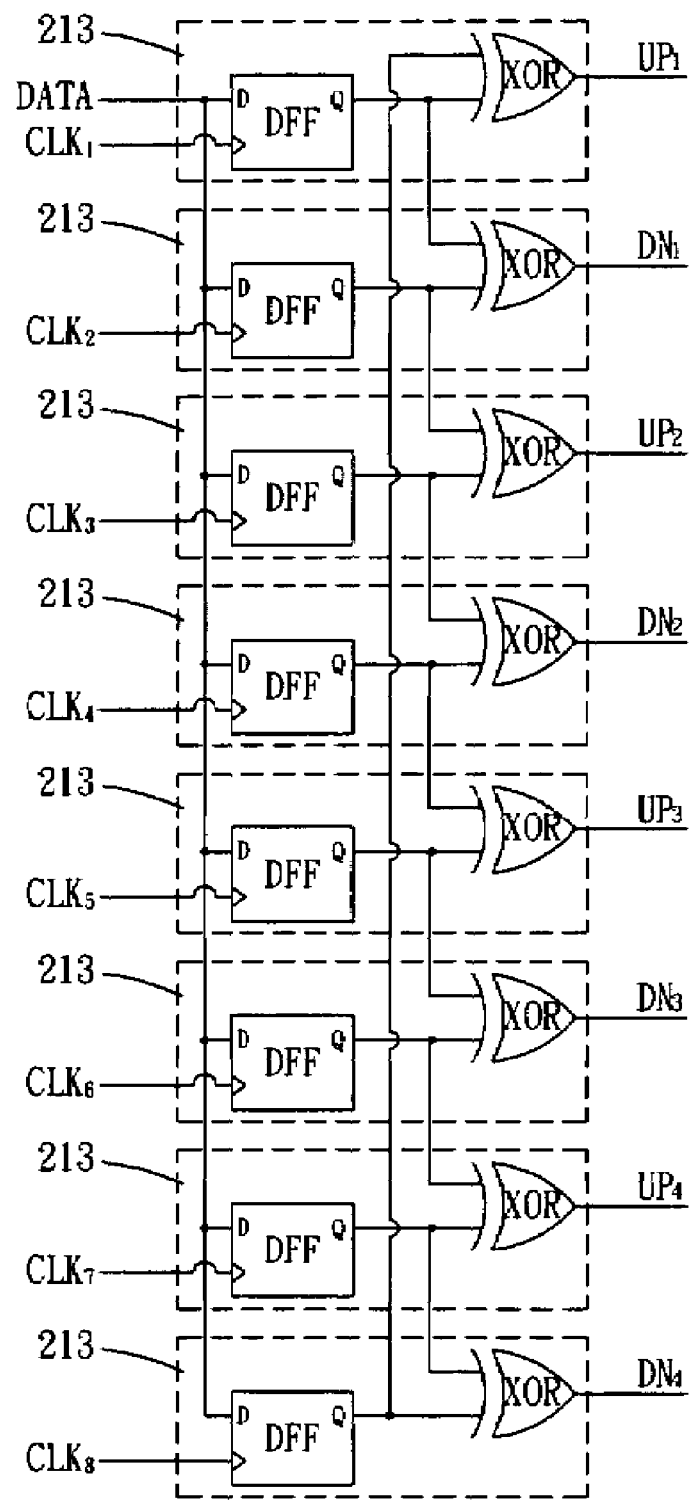
FIG. 3B is a detailed block diagram showing phase detectors in FIG. 3A.

The phase detecting circuit 21 compares a phase difference between the data signal DATA and the clock signals $CLK_1$-$CLK_8$ to generate two proportional control signals $UP_P$, $DN_P$ and two integration control signals $UP_I$, $DN_I$. The phase detecting circuit 21 includes a plurality of phase detectors 213, a first logic unit 211 and a second logic unit 212. In this embodiment, the phase detecting circuit 21 includes eight phase detectors 213. The first logic unit 211 includes two OR gates 211A and 211B. The second logic unit 212 includes two AND gates 212A and 212B. Each phase detector 213 receives one of the clock signals $CLK_1$-$CLK_8$ to compare the phase difference between the data signal DATA and the corresponding clock signal to generate the control signals $UP_1$-$UP_4$ and $DN_1$-$DN_4$. Referring to FIG. 3B, each phase detector 213 includes a D flip-flop DFF and an XOR gate XOR. The D flip-flops DFF receive the data signal DATA and respectively receive the clock signals $CLK_1$-$CLK_8$. The rising edges of the clock signals $CLK_1$-$CLK_8$ sequentially trigger the D flip-flops DFF to sample the data signal DATA. The sampling result is outputted to the XOR gate XOR. Each XOR gate XOR is coupled to the D flip-flop DFF in the same phase detector 213 and the D flip-flop DFF in the previous phase detector 213 in order to receive the outputs from the two D flip-flops DFF. Therefore the XOR gates XOR output the control signals $UP_1$-$UP_4$ and $DN_1$-$DN_4$ respectively.

Figure 4:
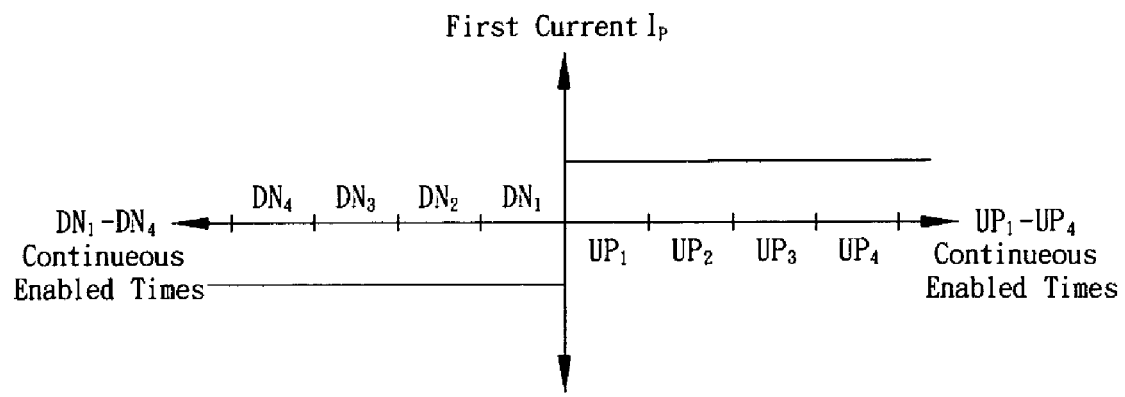
FIG. 4 shows the relationship between the first current $I_P$ and the control signals $UP_1$-$UP_4$, $DN_1$-$DN_4$ in the clock and data recovery circuit according to the embodiment of the invention.

The OR gate 211A performs OR logic on the control signals $UP_1$-$UP_4$ to judge whether one of the control signals $UP_1$-$UP_4$ is enabled to generate the proportional control signal $UP_P$. The OR gate 211B performs OR logic on the control signals $DN_1$-$DN_4$ to judge whether one of the control signals $DN_1$-$DN_4$ is enabled to generate the proportional control signal $DN_P$. When the proportional control signal $UP_P$ or $DN_P$ is enabled, the first charge pump 22 generates the first current $I_P$. Herein, the curve showing the relationship between the first current $I_P$ and the control signals $UP_1$-$UP_4$, $DN_1$-$DN_4$ is illustrated in FIG. 4. The proportional control signal $UP_P$ is enabled whenever any of the control signal $UP_1$-$UP_4$ is enabled. Thereafter, when the control signals $UP_1$-$UP_4$ are continuously enabled, the proportional control signal $UP_P$ is also held in the enabled state. Inversely, the proportional control signal $DN_P$ is enabled whenever any of the control signal $DN_1$-$DN_4$ is enabled. Thereafter, when the control signals $DN_1$-$DN_4$ are continuously enabled, the proportional control signal $DN_P$ is also held in the enabled state.

Figure 5:
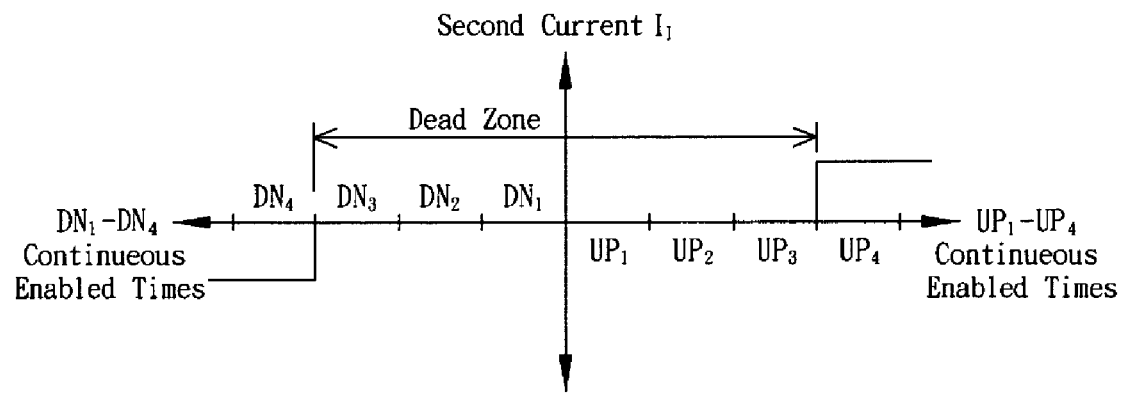
FIG. 5 shows the relationship between the second current $I_I$ and the control signals $UP_1$-$UP_4$, $DN_1$-$DN_4$ in the clock and data recovery circuit according to the embodiment of the invention.

The AND gate 212A performs AND logic on the control signals $UP_1$-$UP_4$ to judge whether all the control signals $UP_1$-$UP_4$ are enabled simultaneously to generate the integration control signal $UP_I$. The AND gate 212B performs AND logic on the control signals $DN_1$-$DN_4$ to judge whether all of the control signals $DN_1$-$DN_4$ are enabled simultaneously to generate the integration control signal $DN_I$. When the integration control signal $UP_I$ or $DN_I$ is enabled, the second charge pump 24 generates the second current $I_I$. Herein, the curve showing the relationship between the second current $I_I$ and the control signals $UP_1$-$UP_4$, $DN_1$-$DN_4$ is illustrated in FIG. 5. The integration control signal $UP_I$ is not enabled until all of the control signals $UP_1$-$UP_4$ are enabled. Thus, a dead zone is generated before the control signal $UP_4$ is not enabled, so that the jitter tolerance is improved. Thereafter, if the control signals $UP_1$-$UP_4$ are continuously enabled, the integration control signal $UP_I$ is also held in the enabled state. Inversely, the integration control signal $DN_I$ is not enabled until all of the control signals $DN_1$-$DN_4$ are enabled. Thus, the dead zone is generated before the control signal $DN_4$ is not enabled. Thereafter, when the control signals $DN_1$-$DN_4$ are continuously enabled, the integration control signal $DN_I$ is also held in the enabled state.

Because the OR gate 211A and the AND gate 212A respectively receive the control signals $UP_1$-$UP_4$ to perform the logic operation, the enabled possibility of the proportional control signal $UP_P$ generated by the OR gate 211A is obviously higher than that of the integration control signal $UP_I$ generated by the AND gate 212A. The OR gate 211B and the AND gate 212B respectively receive the control signals $DN_1$-$DN_4$ to perform the logic operation. Similarly, the enabled possibility of the proportional control signal $DN_P$ generated by the OR gate 211B is higher than that of the integration control signal $DN_I$ generated by the AND gate 212B. Therefore, the proportional control signals $UP_P$, $DN_P$ on the proportional path are more sensitive to the phase differences between the data signal DATA and the clock signals $CLK_1$-$CLK_8$. When the proportional control signal $UP_P$ or $DN_P$ is enabled, the first charge pump 22 is turned on more frequently to output the first current $I_P$ than the second charge pump 24 does. Thus, the proportional voltage $V_P$ responses more quickly than the integration voltage $V_I$ to drive the voltage control oscillating circuit 26 to adjust the phases of the clock signals $CLK_1$-$CLK_8$. On the other hand, because the integration control signals $UP_I$, $DN_I$ are less sensitive, the integration voltage $V_I$ holds the clock signals $CLK_1$-$CLK_8$ outputted from the voltage control oscillating circuit 26 more stable. Consequently, the clock and data recovery circuit 2 reduces the signal jitters more easily, and has the better jitter tolerance. In addition, the second logic unit 212 can enlarge the dead zone of the relationship curve shown in FIG. 5 so as to alleviate the response speed in the integration path.

In this embodiment, each of the OR gates 211A, 211B in the first logic unit 211 and each of the AND gates 212A, 212B in the second logic unit 212 has four inputs and one output. However, the first logic unit 211 and the second logic unit 212 of the invention may also be implemented with other combination logic.

The proportional load circuit 23 includes a resistor 231. The integration load circuit 25 includes a capacitor 251. In this embodiment, each of the first charge pump 22 and the second charge pump 24 is a differential charge pump. Herein, the first charge pump 22 generates a first current $I_P$ according to the proportional control signals $UP_P$, $DN_P$. The first current $I_P$ is injected into the resistor 231 to generate a differential proportional voltage $V_P$ between two terminals of the resistor 231. The differential proportional voltage $V_P$ serves as the input of the voltage control oscillating circuit 26. In addition, the second charge pump 24 generates a second current $I_I$ according to the integration control signals $UP_I$, $DN_I$. The second current $I_I$ charges/discharges the capacitor 251 to generate the differential integration voltage $V_I$ between two terminals of the capacitor 251. The differential integration voltage $V_I$ serves as the input of the voltage control oscillating circuit 26. In order to operate at a stable working point, the first charge pump 22 is coupled to a common mode feedback circuit, and the second charge pump 24 is coupled to another common mode feedback circuit. Compared with the prior art, the circuits following after the phase detecting circuit 21, such as the first charge pump 22, the second charge pump 24 and the voltage control oscillating circuit 26, are implemented by the differential circuits. Thus, the noise performance, such as the PSRR (Power Supply Rejection Rate), in the clock and data recovery circuit 2 is improved. Besides, when operating in the differential mode, the capacitance of the capacitor 251 corresponds to one half that of the capacitor 132 in the single-end mode of the prior art. So, the area of the capacitor 251 is saved resulting from operating in the differential mode.

In this embodiment, the proportional gain, which is provided by the first current $I_P$ in the proportional path, is directly proportional to the product of the first current $I_P$ and the resistance $R_P$ related to the resistor 231. The integration gain, which is provided by the second current $I_I$ in the integration path, is proportional to the ratio of the second current $I_I$ to the capacitance $C_I$ related to the capacitor 251. The stability factor is obtained after dividing the proportional gain by the integration gain. The higher the stability factor is, the stabler the system is. Thus, the stability factor of the embodiment is $$R_p \times C_1 \times \frac{I_p}{I_I}$$

after conversion. In order to obtain a better stability factor and to reduce the costs of the resistor 231 and the capacitor 251, the resistor 231 and the capacitor 251 can be reduced simultaneously, and the first charge pump 22 is utilized to generate the first current $I_P$ larger than the second current $I_I$. Thus, the higher proportional voltage $V_P$ is obtained to drive the voltage control oscillating circuit 26. Such that the voltage control oscillating circuit 26 adjusts the phases of the clock signals $CLK_1$-$CLK_8$ quickly, and instantaneous jitters is reduced more. Compared to the prior art, the first current $I_p$ and the second current $I_I$ can be respectively adjusted, and the resistor 231 and the capacitor 251 can also be adjusted respectively. Thus, the clock and data recovery circuit 2 of the invention is easier to optimize for better efficiency.

Figure 7:
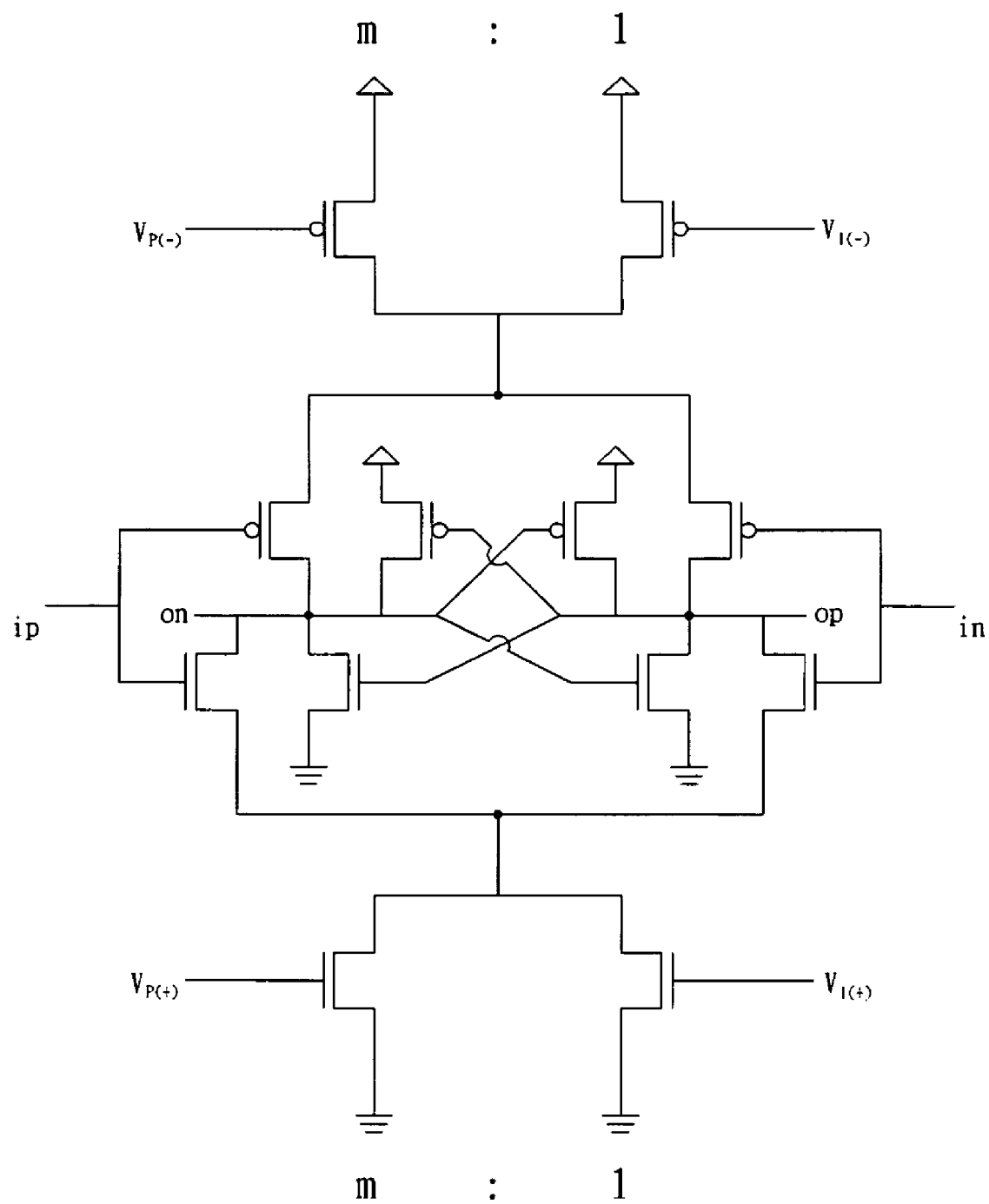
FIG. 7 is a circuit diagram showing the oscillating unit in the voltage control oscillating circuit of the clock and data recovery circuit according to the embodiment of the invention.

In addition, each stage of oscillating unit 261 in the voltage control oscillating circuit 26 has two differential input terminals. So, the differential operation is utilized to further enhance the proportional gain in the proportional path to obtain a better stability factor. FIG. 7 is a detailed circuit diagram showing the oscillating unit 261 in the voltage control oscillating circuit 26. In this embodiment, the aspect ratio of the transistor at the input terminal of the proportional voltage $V_P$ is m times that of the transistor at the input terminal of the integration voltage $V_I$ in the oscillating unit 261, and the gain of the voltage control oscillating circuit 26 is $K_{VCO}$. Thus, the gain in the proportional control path is contributed from the voltage control oscillating circuit 26 and is.

$$\frac{m}{m+1} K_{VCO}.$$

And the gain in the integration control path is contributed from the voltage control oscillating circuit 26 and is.

$$\frac{1}{m+1} K_{VCO}.$$

After calculation, the stability factor is.

$$R_p \times C_1 \times \frac{I_p}{I_I} \times m.$$

The larger m is, the higher the stability factor is, and the stabler the system is. In order to obtain a better stability factor, the aspect ratio of the transistor at the input terminal of the proportional voltage $V_P$ in each stage of oscillating unit 261 can be increased.

Figure 8:
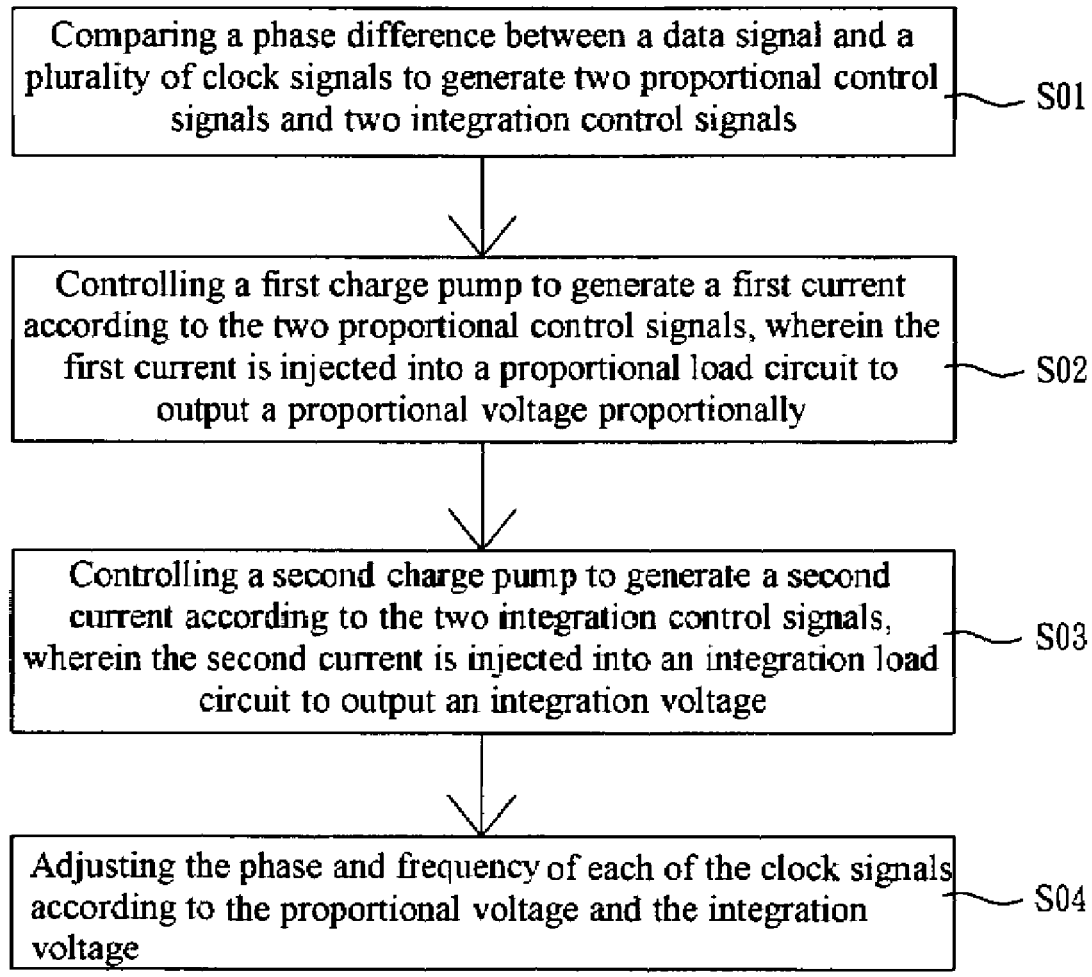
FIG. 8 shows the steps of a method of the clock and data recovery circuit according to the embodiment of the invention.

FIG. 8 shows the steps of a method of the clock and data recovery circuit according to the embodiment of the invention. Referring to FIG. 8, the method includes the following steps S01-S04.

Step S01: comparing a phase difference between a data signal and a plurality of clock signals to generate two proportional control signals and two integration control signals. The clock signals have the same frequency but different phases, and the frequency of the data signal is a multiple of the frequency of the clock signals.

Step S02: controlling a first charge pump to generate a first current according to the two proportional control signals, wherein the first current is injected into a proportional load circuit to output a proportional voltage proportionally.

Step S03: controlling a second charge pump to generate a second current according to the two integration control signals, wherein the second current is injected into an integration load circuit to output an integration voltage.

Step S04: adjusting the phase of each of the clock signals according to the proportional voltage and the integration voltage.

In summary, the clock and data recovery circuit and method of the invention generate the proportional control signal and the integration control signal, which do not interfere with each other. This two signals respectively control the first charge pump and the second charge pump to generate the independent first current and second current. The first and second currents are respectively injected into the proportional load circuit and the integration load circuit to generate the independent proportional voltage and integration voltage applied for adjusting the phase of the clock signal. So, the proportional control path and the integration control path of the invention are separated from and parallel to each other, and each stage circuit and gain in the proportional control path or in the integration control path are adjustable individually. Thus, the difficulty in adjusting the proportional gain and the integration gain individually in the prior art may be overcome, such that the clock and data recovery circuit and the method are easier to optimize and the operation efficiency of the circuit is improved.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A clock and data recovery circuit, comprising:
   a phase detecting circuit for comparing a phase difference between a data signal and a plurality of clock signals to generate two proportional control signals and two integration control signals;
   a first charge pump controlled by the proportional control signals to generate a first current;
   a proportional load circuit for receiving the first current and outputting a proportional voltage in proportion to the first current;
   a second charge pump controlled by the two integration control signals to generate a second current;
   an integration load circuit for receiving the second current to output an integration voltage; and
   a voltage control oscillating circuit for adjusting phases of the clock signals in response to the proportional voltage and the integration voltage, wherein the clock signals have the same frequency but different phases, and the frequency of the data signal is a multiple of the frequency of the clock signals.

2. The clock and data recovery circuit according to claim 1, wherein the proportional load circuit comprises a resistor, and the first current is injected into one terminal of a resistor to output the proportional voltage at the terminal.

3. The clock and data recovery circuit according to claim 1, wherein the integration load circuit comprises a capacitor, and the second current charges/discharges the capacitor to output the integration voltage.

4. The clock and data recovery circuit according to claim 1, wherein the first charge pump and the second charge pump are differential charge pumps.

5. The clock and data recovery circuit according to claim 1, wherein the proportional voltage and the integration voltage are differential signals, and the voltage control oscillating circuit is a differential voltage control oscillator and has two differential input terminals for respectively receiving the proportional voltage and the integration voltage.

6. The clock and data recovery circuit according to claim 1, wherein the phase detecting circuit comprises:
   a plurality of phase detectors for comparing a phase difference between the data signal and the clock signals to generate a plurality of control signals respectively;
   a first logic unit for receiving the two proportional control signals and two integration control signals and generating the proportional control signals when one of the control signals is enabled; and
   a second logic unit for receiving the control signals and generating the integration control signals when all of the control signals are enabled.

7. The clock and data recovery circuit according to claim 6, wherein the first logic unit comprises at least one OR gate and the second logic unit comprises at least one AND gate.

8. The clock and data recovery circuit according to claim 6, wherein the first logic unit is composed of OR gates and the second logic unit is composed of AND gates.

9. A clock and data recovery method, comprising:
   comparing a phase difference between a data signal and a plurality of clock signals to generate two proportional control signals and two integration control signals;
   controlling a first charge pump to generate a first current in response to the two proportional control signals, wherein the first current is injected into a proportional load circuit to output a proportional voltage proportionally;
   controlling a second charge pump to generate a second current in response to the two integration control signals, wherein the second current is injected into an integration load circuit to output an integration voltage; and
   adjusting phases of the clock signals in response to the proportional voltage and the integration voltage, wherein the clock signals have the same frequency but different phases, and the frequency of the data signal is a multiple of the frequency of the clock signals.

10. The method according to claim 9, wherein the proportional load circuit comprises a resistor, and the first current is injected into one terminal of the resistor to output the proportional voltage at the terminal.

11. The method according to claim 9, wherein the integration load circuit comprises a capacitor, and the second current charges/discharges the capacitor to output the integration voltage.

12. The method according to claim 9, wherein the first charge pump and the second charge pump are differential charge pumps.

13. The method according to claim 9, wherein the detecting step comprises:
   comparing the phase difference between the data signal and the clock signals to generate a plurality of control signals;
   generating the proportional control signals when one of the control signals is enabled; and
   generating the integration control signals when all of the control signals are enabled.

* * * * *